United States Patent
Müller et al.

(10) Patent No.: US 7,372,918 B2
(45) Date of Patent: May 13, 2008

(54) TRANSMISSION DEVICE WITH ADAPTIVE DIGITAL PREDISTORTION, TRANSCEIVER WITH TRANSMISSION DEVICE, AND METHOD FOR OPERATING A TRANSMISSION DEVICE

(75) Inventors: Jan-Erik Müller, Ottobrunn (DE); Nazim Ceylan, München (DE)

(73) Assignee: Infineon Technologies AG, Munich (DE)

( * ) Notice: Subject to any disclaimer, the term of this patent is extended or adjusted under 35 U.S.C. 154(b) by 659 days.

(21) Appl. No.: 10/955,385

(22) Filed: Sep. 30, 2004

(65) Prior Publication Data
US 2005/0105642 A1  May 19, 2005

(30) Foreign Application Priority Data
Sep. 30, 2003  (DE) .............................. 103 45 553

(51) Int. Cl.
  *H04L 25/49* (2006.01)
(52) U.S. Cl. .................. 375/296; 375/308; 375/315; 330/127
(58) Field of Classification Search ............ 375/295, 375/296, 297, 302, 308, 309, 315; 330/127, 330/129, 136, 144, 147, 149
See application file for complete search history.

(56) References Cited

U.S. PATENT DOCUMENTS

| | | |
|---|---|---|
| 4,291,277 A | 9/1981 | Davis et al. |
| 5,113,414 A | 5/1992 | Karam et al. |
| 6,072,364 A | 6/2000 | Jeckeln et al. |
| 6,373,902 B1 | 4/2002 | Park et al. |
| 6,477,477 B1 | 11/2002 | Thron et al. |
| 6,741,663 B1 * | 5/2004 | Tapio et al. ............... 375/297 |
| 2003/0035494 A1 | 2/2003 | Bauder et al. |
| 2006/0240786 A1 * | 10/2006 | Liu ......................... 455/114.3 |

FOREIGN PATENT DOCUMENTS

DE   199 43 957 C1   4/2001

(Continued)

OTHER PUBLICATIONS

"L-Band Transmitter Using Kahn EER Technique", Frederick H. Raab, Bernard E. Sigmon, Ronald G. Myers and Robert M. Jackson, IEE Transactions on Microwave Theory and Techniques, vol. 46, No. 12, Dec. 1998, 6 pgs.

(Continued)

*Primary Examiner*—Chieh M. Fan
*Assistant Examiner*—Naheed Ejaz
(74) *Attorney, Agent, or Firm*—Eschweiler & Associates, LLC

(57) ABSTRACT

The invention provides a transmission device having adaptive digital predistortion, which has a transmission path and a feedback path. The transmission path contains a predistortion unit which takes a derived control signal (LS) and baseband signals applied to the input side as a basis for calculating the address of a predistortion coefficient (KO-EFF1) stored in a memory and logically combines this predistortion coefficient with the applied baseband signals in a complex multiplication unit. The use of complex coefficients and of the complex multipliers allows compensation both for AM/AM distortion and for AM/PM distortion in an amplifier device connected downstream of the predistortion unit. Usefully, the feedback path of the transmission device with digital adaptive predistortion can also be implemented using the reception device in a transceiver.

12 Claims, 6 Drawing Sheets

FOREIGN PATENT DOCUMENTS

WO     WO 97/30521 A1     8/1997

OTHER PUBLICATIONS

"High-Linearity RF Amplifier Design", P.B. Kenington, Artech House, Oct. 2000, 24 pgs.

"Effects of Reconstruction Filters in Digital Predistortion Linearizers for RF Power Amplifiers", Lard Sundström, Michael Faulkner and Mats Johansson, IEEE Transactions on Vehicular Technology, vol. 44, No. 1, Feb. 1995, 9 pgs.

"Mobile Phone Power Amplifier Linearity and Efficiency Enhancement Using Digital Predistortion", N. Ceylan, J.E. Mueller, T. Pittorino and R. Weigel, To be submitted to European Microwave Conference, 2003, 3 pgs.

"Survey on PA- Linearisation and Efficiency Enhancement Methods", Nazim Ceylan, Oezhan Koca and Jan-Eric Müller, Mar. 10, 2003, 17 pgs.

"Adaptive Linearization Using Predistortion-Experimental Results", Michael Faulkner and Mats Johansson, IEEE Transactions on Vehicular Technology, vol. 41, No. 2, May 1994, pp. 323-332.

"DSP Controlled Adaptive Feedforward Amplifier Linearizer", Stephen J. Grant, James K. Cavers and Paul A. Goud, 5th IEEE International Conference on Universal Personal Communications, 1996, pp. 788-791.

"High Efficiency and High Linearity InGaP/GaAs Power Amplifiers: Matching Techniques of Source and Load Impedance to Improve Phase Distortion and Linearity", Taisuke Iwai, Shiro Ohara, Hiroshi Yamada, Yasuhiro Yamaguchi, Kenji Imanishi and Kazukiyo Joshin, IEEE Transactions on Electronic Devices, vol. 45, No. 6, Jun. 1998, 5 pgs.

"Comparison of Different Adaptation Algorithms for Adaptive Digital Predistortion Based on EDGE Standard", Kok Chew Lee and Peter Gardner, IEEE MTT-S International Microwave Symposium Digest, 2001, pp. 1353-1356.

"Investigations of Linearity Characteristics for Large-Emitter Area GaAs HBT Power Stages", G.L. Madonna, M. Pfost, R. Schultheis and J.E. Mueller, GAAS 2001 Conference, London, 10 pgs.

"Amplifier Linearization Using a Digital Predistorter with Fast Adaptation and Low Memory Requirements", James K. Cavers, IEEE Transactions on Vehicular Technology, vol. 39, No. 4, Nov. 1990, pp. 374-382.

"Effects of Anti-Aliasing Filters in Feedback Path of Adaptive Predistortion", Weiyun Shan and Lars Sundström, IEEE MTT-S International Microwave Symposium Digest, 2002, pp. 469-472.

"A Complex Polynomial Predistorter Chip in CMOS for Baseband or if Linearization of RF Power Amplifiers", E. Westesson and L. Sundström, IEEE International Symposium on Circuits and Systems, 1999, pp. 1-206-1-209.

"A Novel Series Diode Linearizer for Mobile Radio Power Amplifiers", Kazuhisa Yamauchi, Kazutomi Mori, Masatoshi Nakayama, Yasushi Itoh, Yasuo Mitsui and Osami Ishida, IEEE MTT-S, 1996, pp. 831-834.

"Digital Predistortion Techniques for RF Power Amplifiers with CDMA Applications", Frank Zavosh, Mike Thomas, Chris Thron, Tracy Hall, Daniel Artusi, David Anderson David Ngo and David Runton, Microwave Journal, Oct. 1999, 9 pgs.

"Increasing Talk-Time with Efficient Linear PA's", Stephen Mann, Mark Beach Paul Warr and Joe McGeehan. The Institution of Electrical Engineers, Printed and Published by the IEE Savov Place, London, UK, pp. 6/1-6/7., 2000.

"Microwave Power Amplifiers with Digitally-Controlled Power Supply Voltage for High Efficiency and High Linearity", M. Rajan, K.H. Koo, G. Haiington, C. Fallesen and P. Asbeck, IEEE MTT-S International Microwave symposium, Jun. 2000, 4 pgs.

\* cited by examiner

US 7,372,918 B2

TRANSMISSION DEVICE WITH ADAPTIVE DIGITAL PREDISTORTION, TRANSCEIVER WITH TRANSMISSION DEVICE, AND METHOD FOR OPERATING A TRANSMISSION DEVICE

REFERENCE TO RELATED APPLICATIONS

This application claims the benefit of the priority date of German application DE 103 45 553.1, filed on Sep. 30, 2003, the contents of which are herein incorporated by reference in their entirety.

FIELD OF THE INVENTION

The invention relates to a transmission device, a transceiver incorporating such a device and a method for operating the transmission device.

BACKGROUND OF THE INVENTION

The demands of modern communication standards on the signal quality of transmission devices or the signal quality of transmission devices in transceivers are rising with the growing need for high data rates and with increasing mobility. The now customary multistandard operating modes, for example UMTS, WLAN, require the use of bandwidth efficient, linear modulation types such as QPSK or QAM (Quadrature Amplitude Modulation). This results in a high linearity demand for a transmission device or for the transmission path in a transceiver. In this context, a power amplifier within the transmission path is particularly important as it amplifies the signal which is to be transmitted to achieve the required output power. Such an amplifier should have a high level of linearity, that is to say a linear gain in a wide output power range. At the same time, the power amplifier should have a high level of efficiency, particularly in mobile appliances, which are powered by means of a storage battery. A high level of efficiency, that is to say a high ratio of generated radio frequency output power to used battery power, normally exists only in a range in which the RF response of the amplifier has a nonlinear profile, however.

In mobile communication appliances today, therefore, power amplifiers are used which represent the best possible compromise between linearity of the power amplifier and power consumption, as a result of suitable circuitry. This can be achieved through suitable biasing or a suitable load impedance at the output of the amplifier, as described in the documents by G. L. Madonna et al.: "Investigations of Linearity Characteristics for Large-Emitter Area GaAS HBT Power Stages", GAAS 2001 Conference, London 2001 and Iwai et al.: "High Efficiency and High Linearity InGaP/GaAS HBT Power Amplifiers: Matching Techniques of Source and Load Impedance to Improve Phase Distortion and Linearity", IEEE Transactions on Electronic Devices, Vol. 45, No 6, June 1998. If the linearity of the power amplifier used within the transmission path needs to be improved further; it is customary practice in modern circuits to predistort the input signal for the power amplifier.

The predistortion of the input signal is in a form such that it compensates for the nonlinear gain of the amplifier. In this context, the baseband signal from the transmission device is predistorted at a suitable point. Examples of predistortion within the analog signal processing chain of the baseband are described in the documents Yamauchi et al.: "A Novel Series Diode Linearizer for Mobile Radio Power Amplifiers", IEEE MTT S 1996, pages 831 to 833 and E. Westesson et al.: "A Complex Polynomial Predistorter Chip in CMOS for Baseband or IF Linearization of RF Power Amplifiers", IEEE International Symposium on Circuits and Systems 1999. These analog predistortions can be provided inexpensively using simple supplementary circuits. A drawback of analog predistortion, however, is that the operating conditions, such as temperature, operating point or modulation of the power amplifier, may be altered only within very narrow limits. The limits can be extended by an analog predistortion circuit which can be adapted flexibly. However, such predistortion circuits can be produced only with a high level of complexity and also increase the power consumption again.

In contrast to this, predistortion of the digital baseband signal is very well matched to changing external operating conditions. In the case of adaptive digital predistortion, a portion of the analog output signal behind the power amplifier is output, demodulated and converted into a digital baseband signal again. From the comparison between the converted baseband signal and the original, undistorted baseband signal it is possible to determine the distortion in a portion of the transmission path and particularly in the power amplifier. From this, predistortion coefficients can be calculated. An embodiment with adaptive predistortion is shown in document US 2003/0035494. The drawback of the arrangement presented therein, however, is the high power consumption on account of the continuously operating predistortion unit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

According to one or more aspects of the present invention, a transmission device is provided which has a high output power while having good linearity properties and low power consumption. A transceiver arrangement that facilitates adaptive digital predistortion is also provided. Finally, a method for digital predistortion in a transmission device is provided.

An exemplary transmission device with adaptive digital predistortion comprises a processor unit for outputting a baseband signal having two discrete value components at a first and at a second signal output. The transmission device contains an adaptive predistortion unit having a first signal input, which is connected to the first signal output of the processor unit, having a second signal input, which is connected to the second signal output of the processor unit, and having a first and at least one second control input for supplying discrete value signals. The predistortion unit is configured to provide a signal comprising two discrete value components at a first and at a second signal output, the signal that comprises two discrete value components being derived from an input signal applied to the first and second inputs and from a control signal at at least the first control input. To this end, it contains a coefficient unit for ascertaining a predistortion coefficient which comprises a complex value. This value is dependent on a control signal at a first control input on the coefficient unit and on the complex sum of the levels of signals at the first input and at the second input of the predistortion unit. In addition, the predistortion unit has a circuit for complex multiplication which is coupled to the first and second inputs. The circuit is configured to multiply the components applied to the first and second inputs by the complex predistortion coefficient and to output an output signal derived from the multiplication. Finally, the predistortion unit has an adaptation unit for generating and for transmitting a new complex predistortion coefficient. By virtue of the suitable design of the adaptation unit, said predistortion coefficient is formed at least from the signals applied to the first and second inputs of the predistortion unit, from the first control signal and from a second baseband signal, which comprises a first and a second component and is applied to a second control input on the predistortion unit. The transmission device has a conversion device whose inputs are connected to the outputs of the predistortion unit and which is configured to convert applied discrete value components into continuous value components. The transmission device also contains a modulation device having a first input, which is coupled to the first output of the predistortion unit, and having a second input, which is coupled to the second output of the predistortion unit. The modulation device has a local oscillator input for supplying a local oscillator signal, and also an output and is configured to convert signals applied to the input side into an output signal using the local oscillator signal. The output of the modulation device is coupled to at least one amplification device whose output is connected to an output unit for the purpose of outputting a portion of the output signal from the amplification device. Finally, the transmission device has a conversion unit that converts the portion of the output signal into a baseband signal, the baseband signal comprising a first and a second discrete value component. The conversion unit is configured to provide the first component at a first output and to provide the second components at a second output, the first output being connected to a first tap on the second control input of the predistortion unit, and the second output being connected to a second tap on the second control input of the predistortion unit.

In one example, the predistortion unit has a first and a second operating state. In the first operating state the predistortion unit is operable to output the signals applied to its first and second inputs at its first and second outputs, respectively. Hence, signals applied to the input side are output directly at the output. In the second operating state the predistortion unit is operable to output the first and second components of the derived output signal at its first and second outputs, respectively. The predistortion unit can be switched to the first or to the second operating state by the first control signal. In addition, in line with the invention, the transmission device contains a power control unit whose input is connected to a control output for a discrete valve power control signal from the processor unit and which has at least one output for providing the first control signal, said output being coupled to the first control input of the predistortion unit.

A power control unit is thus provided which uses a control signal to control distortion of the baseband signal in the predistortion unit. The predistortion unit can be switched by the control signal to an operating mode in which the baseband is output in undistorted form. In this operating state, the predistortion unit is deactivated and draws no current.

The amplification device coupled to the output of the modulation device is usefully operated in a range of high efficiency. As a result, the device outputs a signal at high power with low power consumption. If the level of the signal applied to the input of the amplification device is too high, the predistortion unit performs suitable predistortion in order to compensate for the distortion in the amplification device which is brought about by the high input level. If the level of the input signal is just of a magnitude such that sufficient linearity in the RF transfer characteristic continues to exist for simultaneously high efficiency, then the predistortion unit is switched to the first operating state by the control signal and is thus deactivated, and the baseband signal remains undistorted.

Overall, good linearity for the output signal is facilitated, with the power consumption being significantly reduced at the same time. The level of the output signal which is to be transmitted is known to the processor unit, so that the latter uses a suitable power control signal to determine the first control signal for the predistortion unit.

The baseband signal applied to the input side of the predistortion unit is predistorted by the unit such that, having passed through downstream elements of the transmission device, it represents a linear map of the desired signal, which is to be transmitted. The nonlinearities present in the transmission path are thus compensated for in a suitable manner.

The adaptation unit is particularly efficient should external conditions such as temperature or modulation have altered. The new predistortion coefficients generated by the adaptation unit compensate for the nonlinear transfer characteristic of the transmission device. The adaptation unit is also part of the predistortion unit and can thus be activated by the first control signal.

A transceiver having such a transmission device comprises a reception unit having an input and an output, which is configured to convert a signal applied to its input into a baseband signal comprising two discrete value components. In this arrangement, the reception device is the conversion unit, the output of the reception device being coupled to the at least one second control input of the predistortion unit. In addition, the input is connected to a switching apparatus which can adopt two states. In a first switching state the input is coupled to the output unit, and in a second switching state the input is coupled to a reception antenna.

In this example, a transceiver is implemented which contains a reception device which simultaneously forms the feedback path and the conversion unit for the adaptive digital predistortion. It is thus possible to dispense with an additional feedback path, and the reception device is suitably used for outputting and demodulating the signal which is to be transmitted. Such a configuration gives particular savings in terms of cost and space.

In a method for regulating predistortion of a discrete value signal in a transmission device comprising an amplification apparatus, predistortion is carried out when a level for the output signal from the regulatable amplification device is exceeded. The level of the output signal is determined by the control signal which is output by the power control unit. The predistortion is performed by virtue of complex multiplication of the first and second discrete value components of the baseband signal by a complex predistortion coefficient which is dependent on the level of the first and second discrete value components of the baseband signal and on the control signal.

Hence, predistortion is performed merely when the level of the signal to be amplified exceeds a defined limit value. This limit value is the level value after which the RF transfer characteristic of the transmission device has a highly nonlinear profile, that is to say the input level for the amplification device becomes too high.

In one example, coupling between the modulation unit and the amplification device comprises a second amplification device, which can be regulated using a control input. In addition, the power control unit has a second output for providing a second control signal, which output is coupled to the control input of the regulatable amplifier device.

This advantageously allows the input level of the first amplification device to be controlled. Particularly when the latter has a known gain factor, the regulatable amplification device is thus used to set the level of the input signal such that the desired output power is obtained. In an alternative configuration, the first amplification device also contains a regulatable gain factor. In this case, it is particularly advantageous if the first and second control signals are the same control signal. As a result, the predistortion unit is actuated in a suitable manner. If the output level of the regulatable amplification device is low, then no predistortion is necessary, since the signal which is output by the first amplification device has sufficiently good linearity. A control signal which causes a high gain in the regulatable amplification device thus also controls the predistortion unit in a suitable manner.

In another example, the coefficient unit comprises a memory unit containing stored complex predistortion coefficients and also an address calculation unit. The address calculation unit is operative to generate an address signal for a predistortion coefficient stored in the memory unit from the complex sum of the levels of the signals applied to the first and second inputs and from the first control signal at the first control input. The memory device is configured to provide the complex predistortion coefficient determined by the address signal to the multiplication unit.

The memory apparatus may be adapted to store the predistortion coefficients generated and transmitted by the adaptation unit in place of a now old predistortion coefficient determined by the address signal. The predistortion coefficients may also be freshly generated by the adaptation unit only when required. This reduces the power consumption further.

In another example, the adaptation unit has further control inputs for the first control signal and for the predistortion coefficients determined by the address signal. Alternatively, the predistortion unit may have a control input for the first and second components of the derived, that is to say distorted, baseband signal. Hence, the control signals and the predistortion coefficients are also taken into account by the adaptation unit when generating new coefficients. Advantageously, the new predistortion coefficients are calculated and generated using the linear method or the secant method.

With regard to the transceiver with the transmission device and the reception device, a switching device is provided at the input of the reception device. In a first switching state of the switching device, the output unit is connected to the input of the reception device, and in a second switching state, the input of the reception device is coupled to a reception antenna. Such a configuration of the invention is expedient particularly for communication standards which send and receive during different time periods. During a time period in which transmission takes place, the reception device is thus connected to the output device. In another time period, the reception antenna is coupled to the reception device using the second switching state.

BRIEF DESCRIPTION OF THE DRAWINGS

The invention is explained in more detail below wherein reference is made to the following drawings.

DETAILED DESCRIPTION OF THE INVENTION

Figure 1:
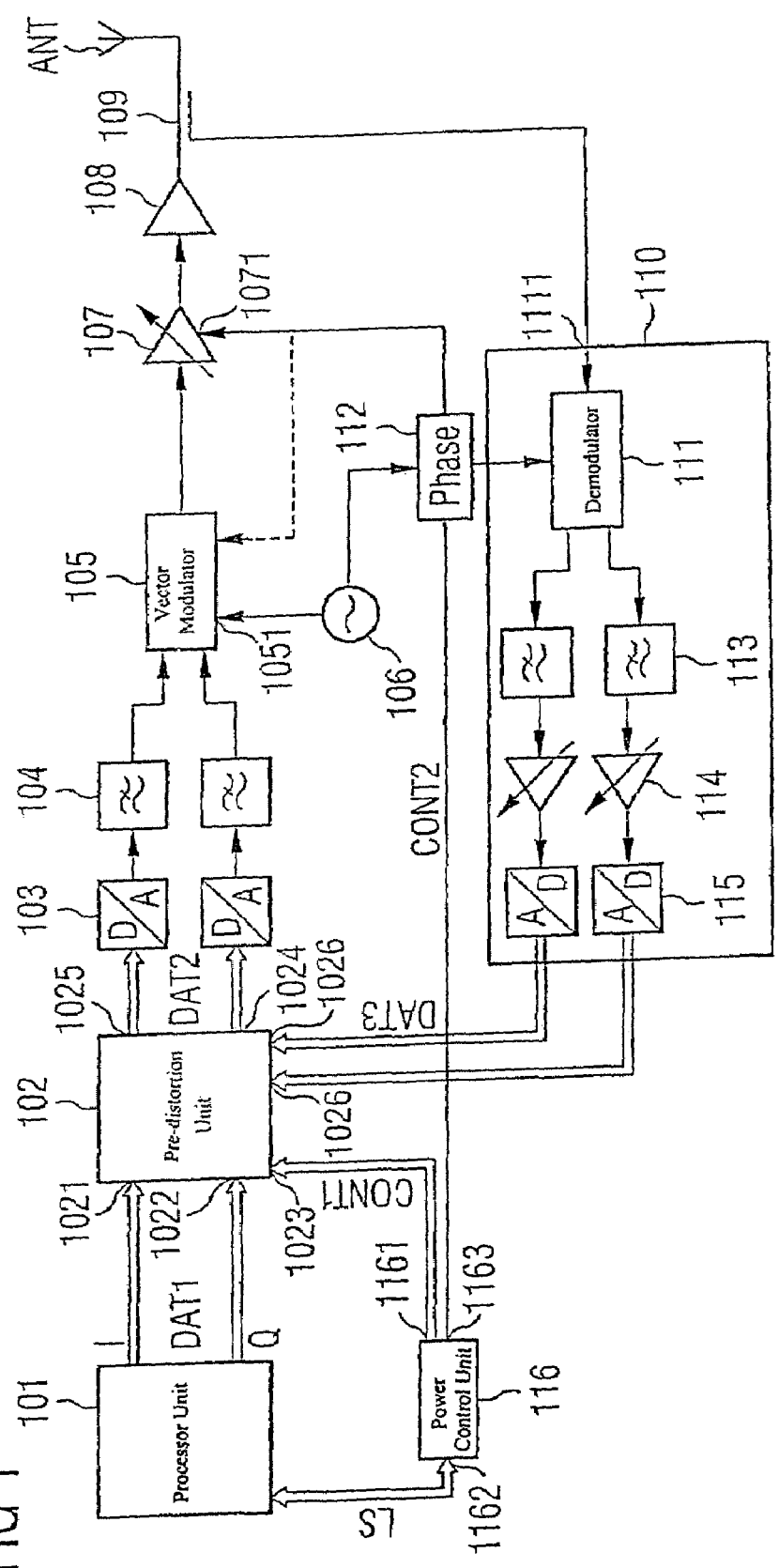
FIG. 1 is a circuit schematic illustrating an exemplary transmission device according to one or more aspects of the present invention.

The present invention pertains to a transmission device or transceiver. One or more aspects of the present invention will now be described with reference to drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. Thus, it will be appreciated that variations of the illustrated systems and methods apart from those illustrated and described herein may exist and that such variations are deemed as falling within the scope of the present invention and the appended claims.

FIG. 1 is a circuit schematic illustrating an exemplary transmission device having adaptive digital predistortion according to one or more aspects of the present invention. A processor unit 101 generates a digital discrete value datastream having two components. The processor unit 101 has a first output for a first component I of the datastream DAT1 and a second output for a second component Q of the datastream DAT1. In addition, it contains a control output for a power control signal LS. This is used to make a setting in the transmission device in order to radiate the signal which is to be transmitted at sufficiently high power. For this purpose, the control output of the processor unit 101 is connected to a power control unit 116.

The power control unit 116 generates a control signal CONT1 from the power control signal LS from the processor unit 101 and outputs this signal to a first output 1161. The control output 1161 of the power control unit 116 is connected to a first control input on a predistortion unit 102. In addition, the predistortion unit contains a first input 1021 for supplying the first discrete value component I of the baseband signal DAT1 and the second input 1022 for supplying the second component Q. A first output on the predistortion unit 102 is connected to a first input on a vector modulator 105 via a digital/analog converter 103 and a low pass filter 104. A second output on the predistortion unit 102 is connected to the second input of the vector modulator 105 via a further digital/analog converter 103 and a further low pass filter 104. At the two outputs of the predistortion unit it is possible to tap off a second baseband signal DAT2, which is derived from the baseband signal DAT1. The two digital/analog converters 103 convert this second baseband signal into an analog baseband signal.

The two continuous-value components of the baseband signal are filtered by the two low pass filters 104 and are supplied to the inputs of the vector modulator. The vector modulator contains a local oscillator input 1051 for supplying a local oscillator signal from an oscillator 106. The vector modulator uses the local oscillator signal to convert signals applied to the input side into an output signal, and outputs this output signal at its output. The output of the vector modulator is connected to a regulatable amplifier 107 whose output connection is connected to the input of a power amplifier 108. A control input on the regulatable amplifier is coupled to the control input 1163 of the power control unit 116 in order to set the gain.

In one exemple, the power amplifier 108 has a known gain. On the basis of the control signal at its control input, the regulatable amplifier 107 amplifies the signal converted by the vector modulator 105 and supplies it to the power amplifier 108. If the transmission power is low, then the gain of the regulatable amplifier 107 is also low. The signal levels of the signals supplied to the power amplifier 108 are likewise low. The amplification by the power amplifier 108 is effected in a linear range. If, by contrast, the output power from the transmission device is intended to be higher, then the gain of the regulatable amplifier 107 also needs to be correspondingly higher. The input amplitudes of the signals on the power amplifier 108 are now likewise much higher, which means that the amplifier no longer amplifies the signals applied to the input side in linear fashion, but rather using a nonlinear transfer characteristic.

Hence, the nonlinearity of the power amplifier 108 is primarily dependent on its input signals and, by derivation therefrom, on the output signal which is to be transmitted. In this case, the processor 1 knows the power to be transmitted for the output signal. Particularly in modern communication standards such as WCDMA, the transmission powers are communicated to the mobile appliance. This is typically done approximately 1000 times per second. The radiation power remains constantly set up until a fresh change. The amplitude of the signal which is to be transmitted is therefore determined by the processor unit using the amplitudes of the input signals, and these are in turn determined by the power control signal LS from the processor unit 101. The control signal CONT1 for the predistortion unit 102 is therefore set such that the predistortion unit 102 predistorts the signal in suitable fashion when the power amplifier 108 has a nonlinear transfer characteristic at the output signal's power which is to be transmitted.

However, the signal transfer characteristic within the transmission device is dependent on external parameters, such as operating temperature, operating voltage, quiescent current and others. It is therefore necessary to change the predistortion by the predistortion unit 102 if appropriate, in order to allow optimum predistortion. The operation of matching predistortion to the external conditions is called adaptive predistortion.

To this end, the output of the power amplifier 108 is provided with an output unit 109 which outputs a portion of the signal which is to be transmitted. The output unit is connected to a demodulator 111 which splits the signal into two analog components again using a local oscillator signal. In this case, the local oscillator input of the demodulator 111 is coupled to the oscillator 106 via a phase shifter 112. The phase shifter 112 takes into account the propagation time differences between the transmission path and the feedback path, so that conversion in the vector modulator 105 and in the demodulator 111 takes place in synchronous phase. It is thus possible to restore the two analog components of the baseband signal exactly. The phase shifter 112 can be dispensed with, given a suitable adaptation method, such as the secant method, for example.

The two components are supplied to two analog/digital converters 115 via two low pass filters 113 and two regulatable baseband amplifiers 114. The two regulatable baseband amplifiers 114 are necessary to have the same signal levels available at the inputs of the analog/digital converters 115. These signal levels are independent of the signal which is fed back by the feedback unit 109. This means that the dynamics of the analog/digital converters can be used in a desired fashion, and only a slight quantification noise arises, which might cause incorrect calculation of the predistortion coefficients.

The outputs of the two analog/digital converters 115 are connected to a second and a third control input on the predistortion unit 102. The predistortion unit 102 calculates the predistortion coefficients for the baseband signal DAT1 from the two fed-back discrete value components of the distorted baseband signal. The adaptive feedback path therefore means that it is possible to determine contemporary predistortion coefficients matched to the operating conditions. In turn, the predistortion unit uses the control signal CONT1 from the power control unit to take into account nonlinear distortion that may arise.

Figure 2:
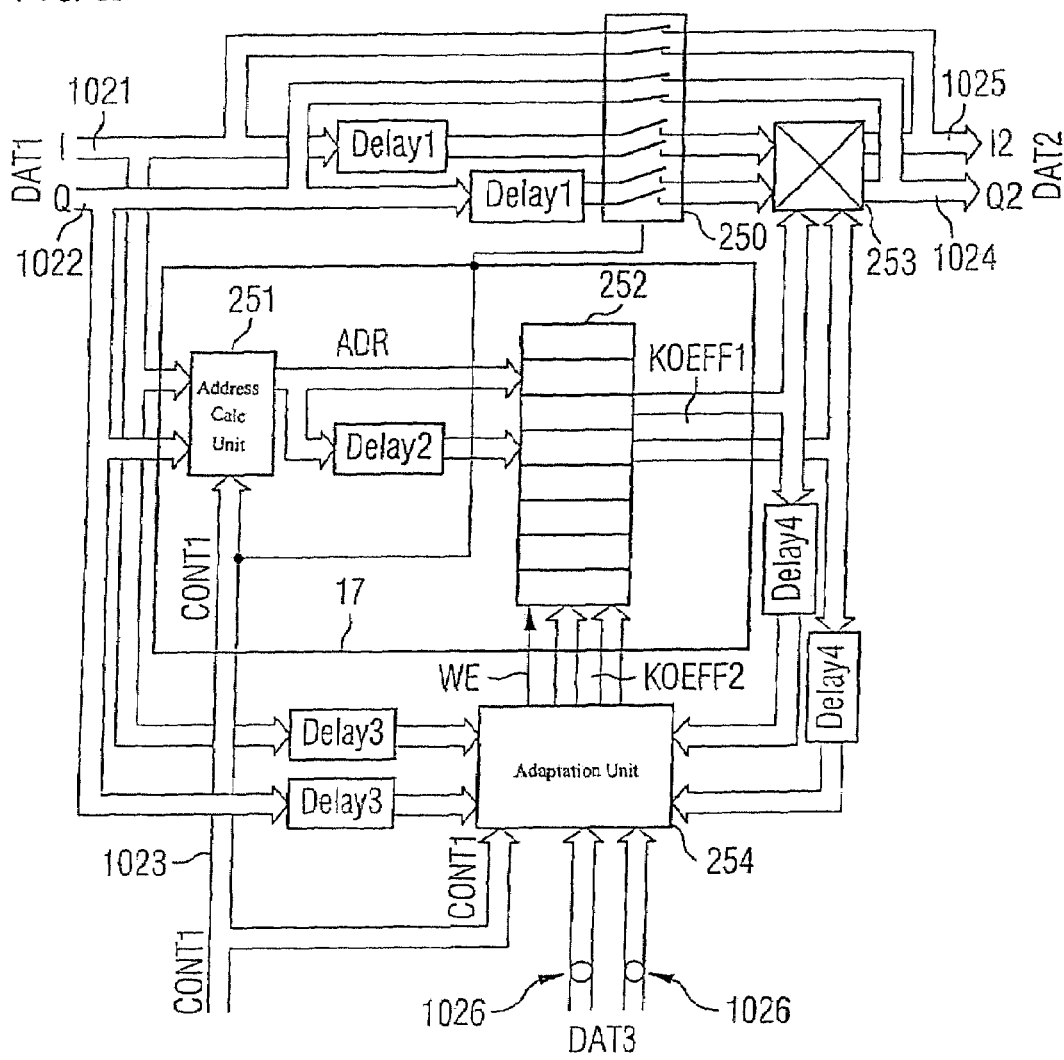
FIG. 2 is a circuit schematic illustrating an exemplary predistortion unit that may be included within a transmission device, such as that presented in FIG. 1, according to one or more aspects of the present invention.

Turning to FIG. 2, a circuit schematic illustrates an exemplary predistortion unit that may be included within a transmission device, such as that presented in FIG. 1, according to one or more aspects of the present invention. The predistortion unit contains a memory device 252 storing complex predistortion coefficients. In this arrangement, the predistortion coefficients represent a complex value and, in so doing, respectively comprise a coefficient pair IK and QK. In this case, the component IK is the real component, and the component QK is the complex value of the predistortion coefficient. The coefficient is respectively stored at an address in the memory device. For a signal level which arises there is a complex predistortion coefficient which is needed for the distortion. The address calculation unit 251 ascertains an address for the coefficient KOEFF1 from the levels of the components I and Q, and also from the control signal CONT1, which indicates the power to be transmitted by the transmission device and hence possible distortion in the power amplifier 108. This address is supplied to the memory device by an address signal ADR. In this case, on the basis of the control signal, respective samples for the components I and Q are used to form the address signal ADR. The coefficient KOEFF1 obtained in this manner is transmitted from the memory device 252 to the multiplication unit.

The complex multiplication unit 253 is connected to the inputs 1021 and 1022 for the discrete-value components I and Q via a delay section DELAY1 and a switch 250. In addition, it contains a coefficient input for supplying the predistortion coefficients KOEFF1. The multiplication unit 253 generates, at its first output, a signal I2 which is derived from the first component I and, at the second output, a signal Q2 which is derived from the component Q. These form the distorted baseband signal DAT2. In this case, the delay section DELAY1 takes into account the time which is required for determining the coefficient address and for calling up the data and also for transmitting the coefficient pair KOEFF1 to the complex multiplication unit.

The switch 250 has two states. In a first switching state it connects the inputs 1021 and 1022 directly to the outputs 1025 and 1024 of the predistortion unit. At the same time, the inputs are isolated from the complex multiplier in this state. In a second switching state it connects the inputs to the inputs of the multiplier 253 and breaks the direct connection between the inputs and the outputs of the predistortion unit. The switch is controlled by the control signal CONT1. Hence, the predistortion unit is bridged on the basis of the control signal when no predistortion is required. At the same time, in such a case the further elements of the predistortion unit are turned off and thus ideally draw substantially no current. The switch may naturally also be fitted at another point in the signal path.

In addition, the predistortion unit has an adaptation unit 254. This is used to replace the coefficients stored in the memory unit 252 with new predistortion coefficients if appropriate. The newly calculated predistortion coefficients are in this case matched to the present characteristics of the signal chain in the transmission device and particularly in the power amplifier. To this end, the adaptation unit is operatively coupled both to the inputs 1021 and 1022 for the two components I and Q of the undistorted baseband signal DAT1 via a third delay section DELAY3 and to the first control connection for the control signal CONT1.

In addition, the adaptation unit contains an input for the baseband signal DAT3 which has been fed back and converted. Finally, the adaptation unit 254 has a further input for the predistortion coefficients KOEFF1.

The adaptation unit ascertains the new predistortion coefficients KOEFF2 for the memory unit 252 from the signals I and Q applied to the input side and from the fed-back signals of the baseband signal DAT3. In this case, however, the undistorted baseband signal with the two components I and Q is delayed in the delay section DELAY3. In this context, the delay is the same as the delay in the line DELAY1 plus the delay in the further transmission path and in the feedback path. In addition, the power control signal CONT1 is likewise required, and also the coefficients KOEFF1. These are routed via a fourth delay section DELAY4, whose delay is the same as the delay of the delay section DELAY3 minus the delay section DELAY1. The calculation is preferably performed using the secant method or a linear method, which contains a plurality of computation operations. Following calculation of the new coefficients KOEFF2 for a sample of the components I and Q, these are stored in the memory unit 252.

A further delay section DELAY2, which is arranged between the address calculation unit 251 and the memory device 252, is used to delay the addressing of the memory unit 252 until the predistortion coefficient KOEFF2 has been calculated. This is then written to the address in the memory which is ascertained by the address calculation unit 251 instead of the old coefficient KOEFF1 using a write signal WE.

Figure 4:
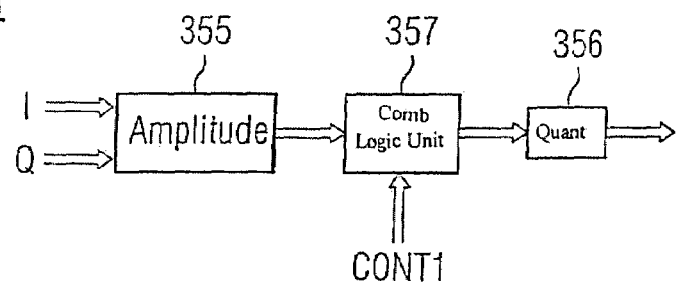
FIG. 4 is a circuit schematic illustrating an exemplary address calculation unit that may be included within a predistortion unit, such as that presented in FIG. 2, according to one or more aspects of the present invention.

The address calculation unit 251 is of much simpler design. FIG. 4 is a circuit schematic illustrating an exemplary address calculation unit that may be included within a predistortion unit, such as that presented in FIG. 2, according to one or more aspects of the present invention. It has an amplitude calculator unit 355 which calculates the amplitude of the complex signal from the components I and Q. The result is scaled with the control signal CONT1. The amplitude scaled in this manner is quantized in a unit 356 and results in an address within the memory. In one example, the output signal from the amplitude calculator unit 355 has a resolution of 8 bits. This results in 256 possible coefficients in the memory which are able to be accessed. The output signal is scaled with a control signal, with the result that this selects a cohesive range from the 256 coefficients. One of these coefficients is used for the present calculation of the predistortion. By way of example, the scaling factor using the control signal CONT1 has the value 0.8. The range of the selected coefficients thus extends from the 1st to the 204th coefficient. For a present level, one of these coefficients is used for the predistortion. The predistortion coefficient is supplied to the complex multiplication unit 253.

Figure 5:
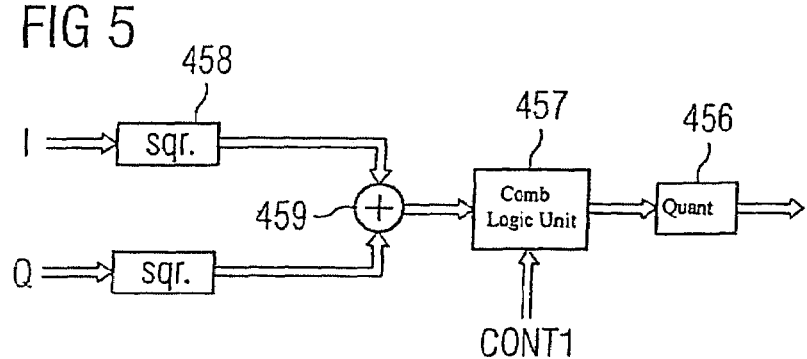
FIG. 5 is a circuit schematic illustrating another exemplary address calculation unit that may be included within a predistortion unit, such as that presented in FIG. 2, according to one or more aspects of the present invention.

Turning to FIG. 5, a circuit schematic illustrates another exemplary address calculation unit that may be included within a predistortion unit, such as that presented in FIG. 2, according to one or more aspects of the present invention. The address calculation unit 251 contains respective squaring units 458 for the path of the first component I and for the path of the second component Q, said squaring units ascertaining the square of the magnitude of the respective component. The outputs of the two squaring elements 458 are connected to an adder 459 which ascertains the square of the magnitude of the complex compiled signal from the components I and Q. The output signal is scaled and is then quantized in the quantization unit. This again directly results in the address of the desired predistortion coefficient in the memory device.

To calculate the address of the stored predistortion coefficients, the address calculation unit therefore uses the amplitude of the components I and Q, since distortion in the power amplifier is brought about by the level of the input signal. The phase of the input signal can be ignored. However, the use of a complex predistortion coefficient in the multiplication unit already takes into account not only amplitude distortion but also the phase distortion as a result of the nonlinearity of the amplifier. The address calculation unit is of particularly simple design if instead of the components I and Q the digital signal is provided as amplitude component and phase component. In that case, it is possible to dispense with the squaring element 458, and the amplitude signal can be scaled directly with the signal CONT1.

Figure 3:
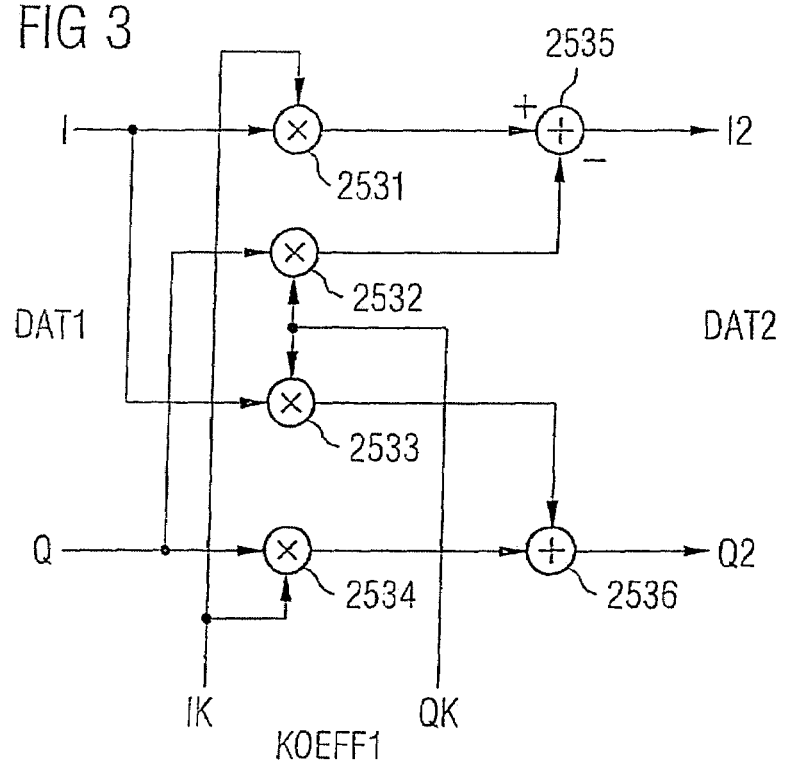
FIG. 3 is a circuit schematic illustrating an exemplary complex multiplication unit that may be included within a predistortion unit, such as that presented in FIG. 2, according to one or more aspects of the present invention.

FIG. 3 is a circuit schematic illustrating an exemplary complex multiplication unit that may be included within a predistortion unit, such as that presented in FIG. 2, according to one or more aspects of the present invention. The use of a complex multiplication unit is advantageous because phase distortion is taken into account, not merely amplitude distortion in the power amplifier or in the transmission path. The complex multiplier 253 has four scalar multipliers 2531 to 2534 and also a subtractor 2535 and an adder 2536.

The signal inputs of the complex multiplier are connected to the inputs of the predistortion unit via the delay section DELAY1. The first input for the component I is connected to an input on the scalar multipliers 2531 and 2533. A first input on the scalar multipliers 2532 and 2534 is connected to the second input for the discrete-value component Q of the baseband signal DAT1. The complex multiplier 253 also contains an input for the complex coefficients KOEFF1, which has the components IK and QK. The complex coefficient input for the component IK is connected to a second input on the scalar multipliers 2531 and 2534. A respective second input on the scalar multipliers 2532 and 2533 is connected to the second input for the component QK of the predistortion coefficient KOEFF1.

The output of the scalar multiplier 2531 is routed to a subtractor 2535, and the output of the scalar multiplier 2532 is connected to the second input of the subtractor 2535. The latter subtracts the output signal from the scalar multiplier 2535 from the output signal from the scalar multiplier 2532. The outputs of the scalar multipliers 2533 and 2534 are connected to an adder 2536, whose output signal forms the component Q2 of the distorted baseband signal DAT2. This circuit multiplies the baseband signal DAT1, which represents a complex value, by a complex predistortion coefficient. The result is the suitable predistorted baseband signal. In this case, the coefficients correspond to the inverse signal transfer function of the amplification device.

It is appropriate to take into account not just the distortion of the amplification device but also all nonlinear components which arise in the transmitter chain. If appropriate, it is also possible to store just a few coefficients in the memory device, and to obtain others by means of extrapolation. In that case, the predistortion circuit is extended by an extrapolation circuit.

One or more aspects of the invention thus provide the transmission device with a power control unit which transmits a control signal to a predistortion unit, which multiplies a digital baseband signal by predistortion coefficients on the basis of the control signal using a complex multiplier. In this case, the predistortion unit is active when the linearity of the output signal is no longer sufficient at the power which is to be radiated.

In this arrangement, the predistortion coefficients to be used are efficiently taken from a memory device. The address of the predistortion coefficient to be taken is determined using an address calculation unit in a simple manner by merely ascertaining the amplitudes of the baseband signal components I and Q and scaling them with the control signal. The signal calculated in this manner represents the address of the predistortion coefficient which is to be used, which is multiplied by the undistorted input signal in complex fashion.

A feedback path is usefully provided which demodulates a portion of the signal to be transmitted and ascertains a baseband signal containing the distorted components therefrom. This baseband signal is compared with the undistorted baseband signal data within the predistortion unit using an adaptation unit. As a result, new predistortion coefficients can be linked and stored in the memory device, these predistortion coefficients taking into account altered operating conditions in the transmission device. In addition, the reception path in a transceiver can be used as feedback path. This additionally allows cost and space to be saved. As a result of suitable design of the supply for the output amplifier by connecting a DC/DC converter, it is possible to select various RF transfer characteristics. The DC/DC converter is usefully coupled to the power control unit 116, so that the selection depends on the output power demanded.

Figure 6:
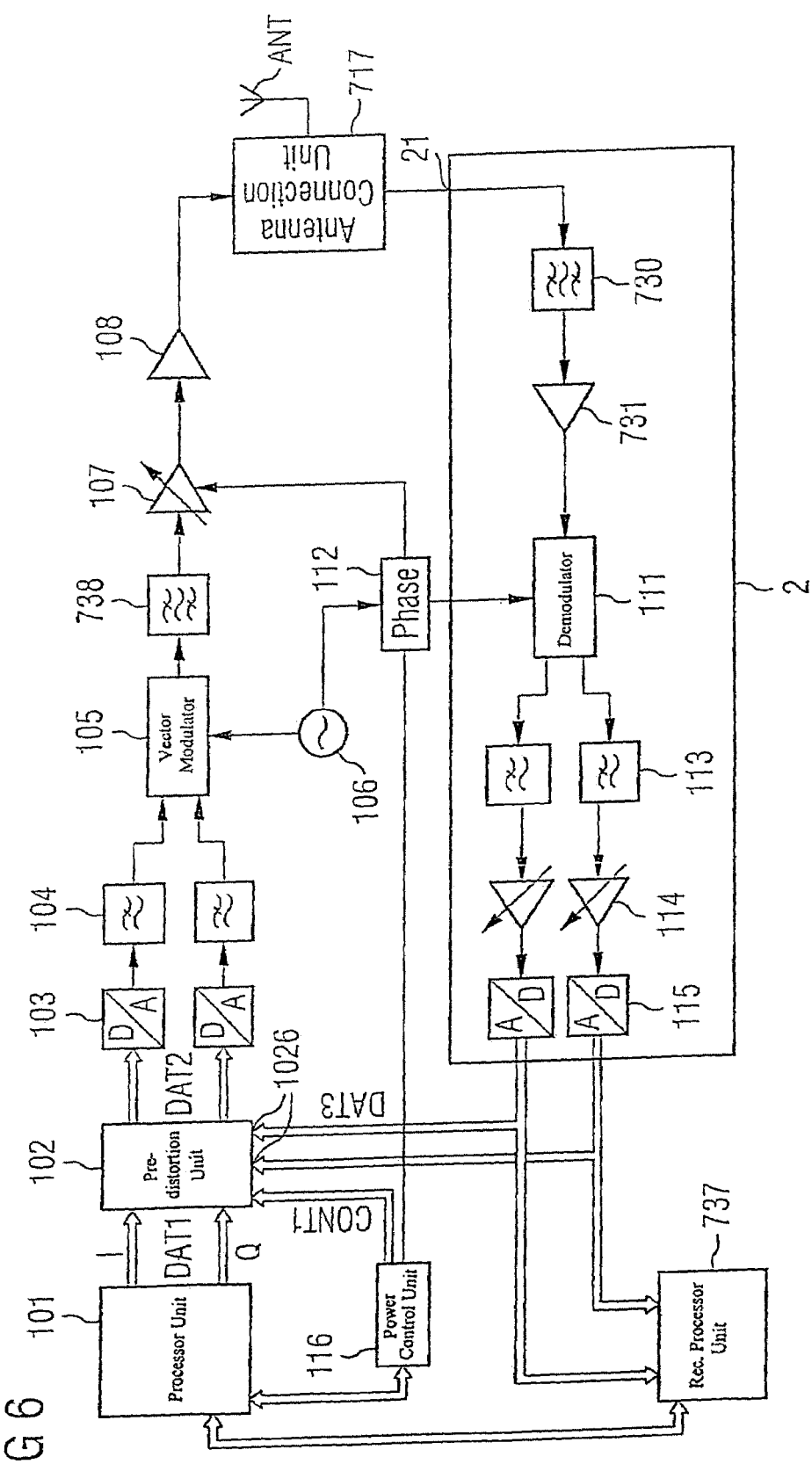
FIG. 6 is a circuit schematic illustrating another exemplary transmission device according to one or more aspects of the present invention.

FIG. 6 is a circuit schematic illustrating another exemplary transmission device according to one or more aspects of the present invention. In particular, FIG. 6 shows a block diagram of a transceiver with a transmission path and a reception path. In this arrangement, the transmission path is designed in the same manner as the transmission path in FIG. 1. In this case, the amplifier 108 is connected to the antenna ANT via a duplexer 717. At the same time, the duplexer 717 also couples the antenna ANT to the reception path 2, which contains a bandpass filter 730 and a low noise amplifier 731. The rest of the reception path is of similar design to the adaptive feedback unit 2 in FIG. 1. The two outputs of the D/A converters 115 are connected not just to the input 1026 of the predistortion unit, however, but also to a processor unit 737 in addition. The latter undertakes the further signal processing for the data received.

In this configuration, the reception path is concurrently used for the adaptive feedback. A prerequisite for this is that no data be received during this time. It is also necessary for the connecting piece 717, in the example illustrated of the duplexer, not to have excessive isolation between the transmission path and the reception path. The leakage signal is to be of sufficient magnitude for error free demodulation to be promoted. In the case of the WCDMA telecommunication standard, transmission and reception usually takes place concurrently on two different frequencies. At particular times and in particular modes of operation, however, it is possible to use the reception path for the adaptive predistortion.

Figure 7:
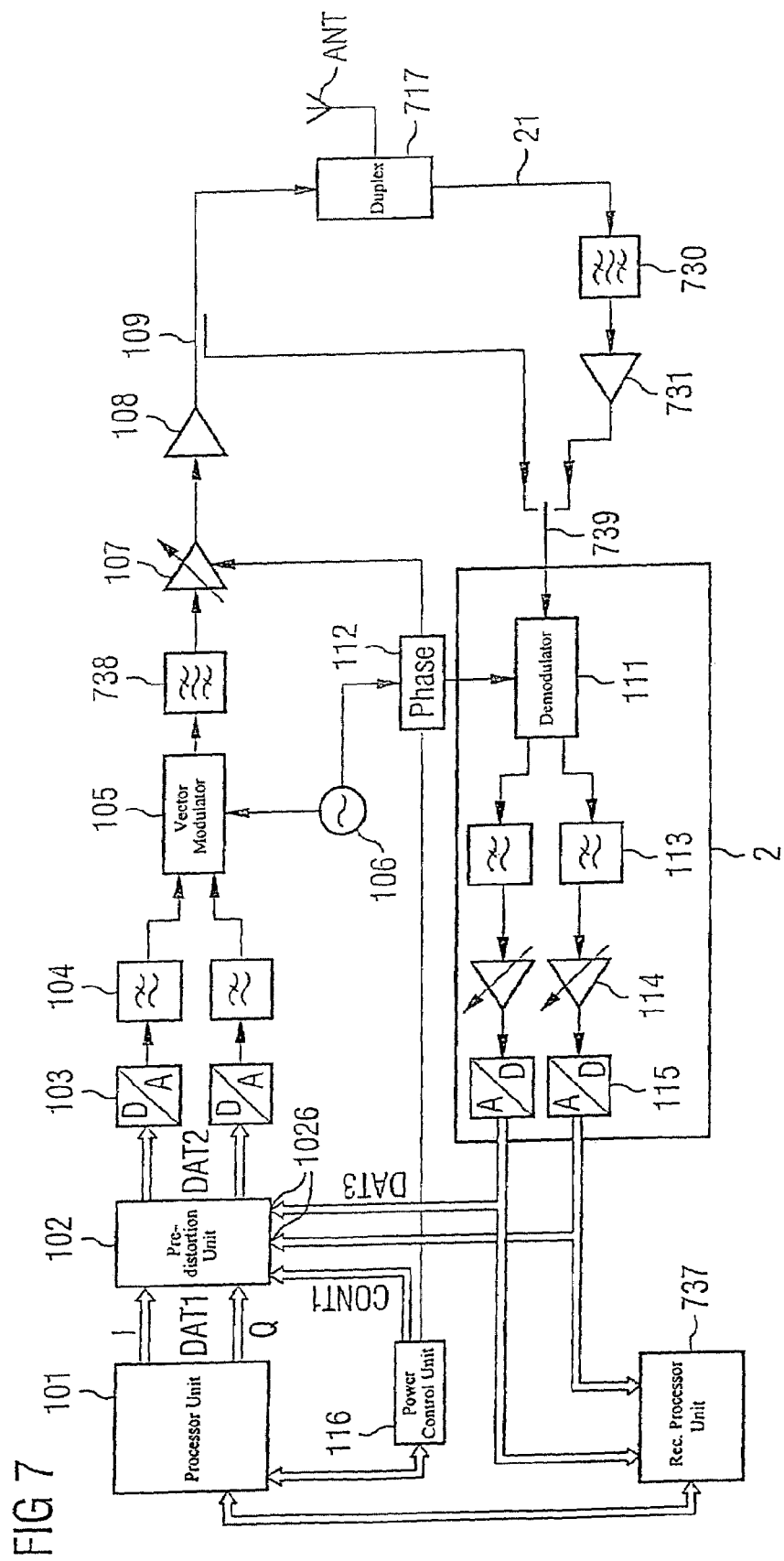
FIG. 7 is a circuit schematic illustrating yet another exemplary transmission device according to one or more aspects of the present invention.

FIG. 7 is a circuit schematic illustrating yet another exemplary transmission device according to one or more aspects of the present invention. In the example of the transceiver in FIG. 7, the transmission path differs by the output element 109 and the reception path differs by the switch 739 from the transceivers in FIGS. 1 and 6. This configuration is particularly advantageous for the EDGE mobile radio standard or for other TDD systems which operate with timeslots, such as WCDMA TDD or 802.11. During a reception timeslot, the switch 739 is switched such that the received signal amplified by the amplifier 731 arrives at the demodulator 111. During a transmission timeslot, a portion of the transmitted signal is output in the coupler 109 and is supplied to the adaptive feedback unit 2 via the switch 739. Adaptive predistortion can therefore always be performed during a transmission timeslot.

Figure 8:
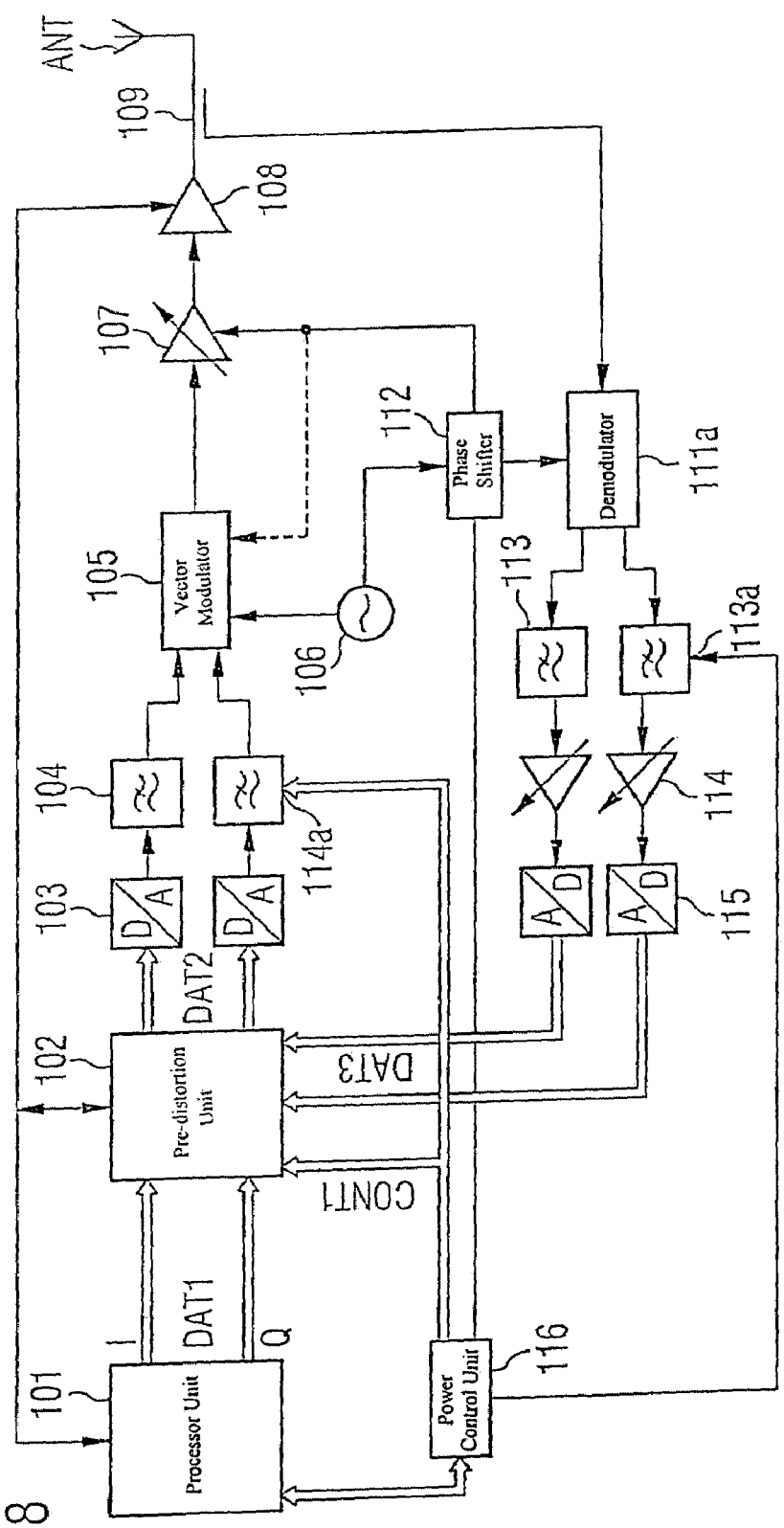
FIG. 8 is a circuit schematic illustrating still another exemplary transmission device according to one or more aspects of the present invention.

FIG. 8 is a circuit schematic illustrating still another exemplary transmission device according to one or more aspects of the present invention. Under real conditions, the radiation characteristic of the antenna ANT changes, since the antenna is influenced by environmental influences, for example by metal or dielectric objects in close proximity to the antenna. Changes in radiation characteristics as a result of the external environmental influences may result in changes in the input impedance of the antenna. Such changes likewise result in a change of impedance at the output of the power amplifier 108.

As a result of the change in the input impedance of the antenna, the match between the power amplifier 108 and the downstream components of the inventive transceiver changes. In the case of the bandwidth efficient modulation methods, such as are used for the CDMA 2000 and WCDMA/UTMS mobile radio standards, the demanded linearity conditions on the transmission stage and particularly on the output amplifier 108 can no longer be met under these conditions.

The cause of a change in the linearity in the power amplifier 108 lies, inter alia, in the reflected power flowing back into the output of the power amplifier 108, said power being generated on account of the mismatch between the output impedance of the power amplifier 108 and the input impedance of the antenna ANT. For this reason, a circulator is normally connected between power amplifier 108 and antenna ANT in order to decouple the power amplifier and the antenna from one another. Such a circulator is relatively expensive, however, and cannot be integrated monolithically on a chip.

The example presented in FIG. 8 provides a solution that allows the linearity demand to be met without a circulator. This makes it possible to connect the output of the power amplifier 108 to the antenna ANT without needing to use an additional circulator. Components having the same function or the same action bear the same reference symbols in this case.

In this arrangement, the output unit 109 is in the form of a directional coupler. Such a directional coupler outputs a portion of the power which the power amplifier 108 outputs in the direction of the antenna ANT and ascertains said power's amplitude and phase values. If a mismatch between the output impedance of the amplifier 108 and the input impedance of the antenna ANT now means that a portion of the power which is output by the power amplifier is reflected by the antenna, then the directional coupler 109 also ascertains the reflected power's amplitude and phase.

The output power is forwarded from the directional coupler 109 to the modulator arrangement 111*a*. This may be the demodulator arrangement in a receiver path implemented in the transceiver or else a special demodulator arrangement optimized for the adaptive predistortion. Following demodulation into the complex components I and Q, these components are supplied to the low pass filters 113, are amplified by a programmable amplifier 114 and are converted into the digital signals using the A/D converters 115. The datastream which is output by the analog/digital converters now likewise permits a statement about a mismatch between the output 108 and the antenna ANT.

Since the linearity response of the entire transmission path is also dependent, inter alia, on a match between the output of the power amplifier 108 and the antenna ANT, it is now possible to distort the digital baseband signal DAT1 in suitable fashion in order to compensate for the mismatch in this way. Since the change in the antenna impedance takes place relatively slowly in comparison with the signal transfer periods normally used in the mobile radio standards, the predistortion coefficients can be readjusted in order to compensate for the change in the impedance in this manner.

Further, the predistortion of the digital baseband signal results in a broader frequency spectrum. For this reason, the low pass filters 104 need to be suitably adapted, so that additional phase distortion does not arise on account of too small a filter bandwidth. This can be achieved by a filter changeover system which changes over the bandwidth according to active or inactive digital predistortion. For this purpose, the illustrated example is provided with switchable filters 104 which have their acutating input 114 connected to the processor 101 via the control unit 116. The same also applies to the mixers 105 and amplifiers 107 connected downstream of the filter 104. Their bandwidth likewise needs to be chosen to be of corresponding size. Bandwidth changeover is likewise provided for the reception path and particularly for the low pass filter 113. These filters 113 likewise have an actuating input 113*a* connected to the processor via the power control unit 116.

In addition, the digital/analog converters may be configured to have a relatively high resolution, to improve the signal-to-noise ratio. Usually an additional resolution of one bit is sufficient to suppress the quantization noise to a sufficient extent. In principle, the distortion governs how many bits are additionally needed. If the magnitude of the maximum coefficient is below the values 2, 4, 8, then 1, 2, 3 additional bits are needed.

In addition, the directional coupler 109 makes it possible to provide a protective circuit for the output of the power amplifier 108. Such a protective circuit is advantageous when a mismatch causes the power reflected by the antenna to rise sharply, which means that the energy flowing back into the output of the power amplifier might result in damage to the power amplifier 108. The rise in the power of the reflected signal is detected by the directional coupler 109, and is converted into digital signals by the downstream demodulator arrangement 111 and the A/D converters. When these coefficients are transferred to the predistortion unit, the predistortion unit establishes a possible risk of overload for the power amplifier 108 and conveys this both to the processor 101 and to the power amplifier 108.

The power amplifier 108 can then be turned off in order to avoid any damage. It is similarly possible for the actual demodulator arrangement 111*a* to contain a power detector which ascertains the power component of the reflected signal and forwards it directly to the processor 101. On the basis of the reflected power, suitable protective measures are thus possible. These may be, by way of example, reduction of the total output power or turning-off of the power amplifier 108. Such a protective circuit therefore makes it possible to reduce the electric strength of the power amplifiers 108 and possibly 107 used and instead to improve the radio frequency properties and particularly the linearity properties of the power amplifiers. This increases the efficiency of the entire arrangement, and the chip area required is reduced.

The illustrated examples are designed such that the additional power requirement brought about by the digital predistortion is low as compared with the savings for the amplifiers and particularly for the power amplifier 108. This advantageously reduces the power consumption in the overall system.

To ascertain the predistortion coefficients, it is advantageous, in contrast to the base station implementations, to pay no attention to particularly high accuracy for the predistortion and for the linearity, but rather to activate the feedback path 110 with its demodulator 111 or 111*a* and with the downstream switching elements intermittently. Such a practice is sufficient, since in modern mobile radio standards the output power from the mobile appliance is adjusted by the base station once in a timeslot if the conditions should have altered from timeslot to timeslot. A timeslot has the duration of approximately 1 msec. A typical example of such a mobile radio standard in which the output power from the mobile appliance is set by the base station is the mobile radio standard WCDMA/UMTS.

The processor 101 accordingly knows the maximum power which can arise in the present timeslot. Digital predistortion of the baseband data is thus required when the maximum power to be output is above a determined limit value and the linearity demands cannot be met without predistortion. Since the change in an antenna impedance usually takes place in a range above 10 msec, continuous predistortion and readjustment of the predistortion coefficients stored in the predistortion unit are possible at all times.

In addition, it is also possible to make use of the fact that very high powers which typically result in distortion appear only seldom in the continuously output signal. This means that it is possible to activate the feedback loop even more seldom. Storing the predistortion coefficients means that an occasional readjustment, update or random check of the individual coefficients is merely necessary to ensure the quality of the predistortion. In addition, such an update of the coefficients can be made dependent on various conditions. Examples mentioned for these are the age of the available coefficients, the change in the operating condition and the changes in the input impedance.

To activate the digital predistortion, it suffices to define the power limit at the output of the power amplifier 108 for the case in which a constant operating voltage is used. If the power limit is accordingly exceeded, then the input signal for the power amplifier 108 needs to be suitably predistorted. If, additionally, DC/DC converters with incrementally or continuously variable operating voltage are to be used, then in respective timeslots a logic unit can be used to make a decision both regarding the operating voltage to be used and regarding the activation of the digital predistortion. Digital predistortion is thus dependent on the operating voltage used and on the maximum power which can be expected. The power limit which results in deactivation of the digital predistortion should be placed such that below this power limit the power amplifier already operates with sufficient linearity, which means that a relatively small change in the impedance of the antenna no longer results in nonlinear distortion in the power amplifier.

The inventive transceiver circuit and the method for performing digital predistortion on the basis of the power which can be expected can be provided, particularly in future mobile communication appliances, using little additional complexity. Preferably, a plurality of receivers and transmitters can be provided in parallel in such a mobile communication appliance, and can then be flexibly configured and thus also used as part of the required feedback path. Particularly in TDMA systems, which already have timeslots, which have provision for transmitting and receiving at respectively different times, implementation with little additional complexity is possible. It is likewise conceivable to provide a plurality of predistortion coefficients for the various parallel connected amplifier trains in the predistortion unit.

In principle, the inventive transceiver arrangement can be used to cover different applications. Thus, in the case of saturation mode, as is required for the GSM mobile radio standard, it is conceivable to deactivate the digital predistortion. For a linear mode, as is required in the case of the CDMA and UMTS mobile radio standards, the digital predistortion is activated on the basis of the output power.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, components, units, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

The invention claimed is:

1. A transmission device with adaptive digital predistortion, comprising:
   a processor unit for providing a first discrete-value component of a baseband signal at a first output and a second discrete-value component at a second output;
   a predistortion unit, connected to the outputs of the processor unit, having a first and a second input and having a first and a second output,
   wherein the predistortion unit comprises a coefficient unit for ascertaining a predistortion coefficient, representing a complex value, on the basis of a first control signal at a first control input on the coefficient unit, a level for the first component, which is applied to the first input, and a level for the second component, which is applied to the second input,
   wherein the predistortion unit comprises a multiplication unit for outputting an output signal, derived from the first component, and from the second component, and from the predistortion coefficient, having a third discrete value component at the first output and having a fourth discrete value component at the second output,
   wherein the predistortion unit comprises an adaptation unit for generating, and for transmitting to the coefficient unit, a new complex predistortion coefficient from at least one of the first component, the second component, the first control signal and a second baseband signal which is applied to a second control input and comprises a fifth component and a sixth component;
   a modulation device having a first input, which is operatively coupled to the first output of the predistortion unit, having a second input, which is operatively coupled to the second output of the predistortion unit, having a local oscillator input and having an output for providing signals;
   at least one amplification device having an input which is operatively coupled to the output of the modulation device;
   an output unit, connected to the output of the at least one amplification device, for outputting a portion of an output signal from the at least one amplifier arrangement;
   a conversion unit for converting the portion of the output signal into the second baseband signal comprising the fifth and the sixth discrete values components, having an input, which is connected to the output unit, and a first output for providing the fifth discrete value component and a second output for providing the sixth discrete value component, which are respectively coupled to one of at least two connections on the second control input of the predistortion unit; wherein the predistortion unit has a first and a second operating state, and in the first operating state is configured to output the first component at the first output and the second component at the second output, and in the second operating state is configured to output the third and fourth components of the derived output signal at the first and second outputs,
   wherein the predistortion unit can be switched to the first or to the second operating state by the first control signal at the control input, and
   a power control unit having an inputfor supplying a discrete-value power control signal to provide the first control signal at a first output of the power control unit, which is operatively coupled to the control input of the predistortion unit.

2. The transmission device of claim 1, wherein the coupling between the modulation unit and the amplification device comprises a regulatable amplification device having a control input which is operatively coupled to a second output on the power control unit to provide a second control signal.

3. The transmission device of claim 2, wherein the first control signal at the first output and the second control signal at the second output of the power control unit are in the form of an identical control signal.

4. The transmission device of claim 1, wherein the coefficient unit for ascertaining the predistortion coefficients of the predistortion unit comprises a memory apparatus stores the predistortion coefficients and also an address calculation unit, the address calculation unit configured to generate an address signal for the predistortion coefficient stored in the memory apparatus from the level of the first and second discrete-value components and from the first control signal at the first control input, and the memory apparatus configured to provide the complex predistortion coefficient determined by the address signal to the multiplication unit.

5. The transmission device of claim 4, wherein the memory apparatus is configured to store the new complex predistortion coefficient which has been generated and has been transmitted from the adaptation unit to the coefficient unit in place of the predistortion coefficient determined by the address signal.

6. The transmission device of claim 1, wherein the adaptation unit is configured to generate the new complex predistortion coefficient on a basis of at least one of the predistortion coefficient and the second baseband signal.

7. The transmission device of claim 1, wherein the output unit is operatively coupled to an antenna and is configured to detect an impedance change in the antenna.

8. The transmission device of claim 1, wherein the output unit comprises at least one directional coupler and is configured to detect a signal power which is present at the output of the at least one amplifier arrangement.

9. The transmission device of claim 1, wherein the output unit is configured to detect at least one of an amplitude and phase for the output signal of the at least one amplification device and an amplitude and phase for a signal reflected by a circuit located downstream of the at least one amplifier arrangement.

10. The transmission device of claim 1, wherein the predistortion unit has a filter with adjustable filter bandwidth, the filter comprising an actuating input which is operatively coupled to the processor unit.

11. The transmission device of claim 1, further comprising:
a reception device which has an input and an output and which is configured to convert a signal applied to the input into the second baseband signal comprising the fifth and the sixth discrete values components, wherein the reception device comprises the conversion unit, and the output of the reception device is operatively coupled to the second control input of the predistortion unit.

12. The transmission device of claim 11, wherein the input of the reception device is connected to a switching apparatus which comprises at least two switching states, the input being operatively coupled to the output unit in a first switching state of the switching apparatus and being operatively coupled to a reception antenna on a transceiver in a second switching state.

* * * * *